United States Patent
Numata et al.

(10) Patent No.: US 11,404,242 B2
(45) Date of Patent: Aug. 2, 2022

(54) CHARGED PARTICLE BEAM DEVICE AND METHOD FOR SETTING CONDITION IN CHARGED PARTICLE BEAM DEVICE

(71) Applicant: Hitachi High-Technologies Corporation, Tokyo (JP)

(72) Inventors: Yuki Numata, Tokyo (JP); Hirofumi Sato, Tokyo (JP); Shigeru Kawamata, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 154 days.

(21) Appl. No.: 16/604,876

(22) PCT Filed: Apr. 21, 2017

(86) PCT No.: PCT/JP2017/015961
§ 371 (c)(1),
(2) Date: Oct. 11, 2019

(87) PCT Pub. No.: WO2018/193605
PCT Pub. Date: Oct. 25, 2018

(65) Prior Publication Data
US 2020/0126754 A1    Apr. 23, 2020

(51) Int. Cl.
*H01J 37/22*    (2006.01)
*H01J 37/28*    (2006.01)
*H01J 37/26*    (2006.01)

(52) U.S. Cl.
CPC ............ *H01J 37/265* (2013.01); *H01J 37/22* (2013.01); *H01J 37/28* (2013.01)

(58) Field of Classification Search
CPC ........... H01J 37/265; H01J 37/22; H01J 37/28
See application file for complete search history.

(56) References Cited

U.S. PATENT DOCUMENTS

2003/0193026 A1* 10/2003 Takagi ............... G01N 23/2251
250/311
2006/0151700 A1    7/2006 Honda et al.
(Continued)

FOREIGN PATENT DOCUMENTS

| JP | 2006-196281 A | 7/2006 |
| JP | 2010-16002 A | 1/2010 |
| JP | 2014-146526 A | 8/2014 |

OTHER PUBLICATIONS

International Search Report (PCT/ISA/210) issued in PCT Application No. PCT/JP2017/015961 dated Jul. 11, 2017 with English translation (three pages).
(Continued)

*Primary Examiner* — Sean M Luck
(74) *Attorney, Agent, or Firm* — Crowell & Moring LLP

(57) ABSTRACT

To assist an operator in setting an observation conditions, so as to acquire an image with a desired image quality (such as contrast) in a charged particle beam device without falling into trial and error based on the experience of the operator. Therefore, the charged particle beam device includes a stage 115 on which a sample is placed, a charged particle optical system configured to irradiate the sample with a charged particle beam, detectors 121 and 122 configured to detect an electron generated by an interaction between the charged particle beam and the sample, a control unit 103 configured to control the stage and the charged particle optical system according to an observation condition set by the operator and configured to form an image based on a detection signal from the detectors, and a display 104 configured to display an observation assist screen for setting the observation condition. The control unit displays, on the observation assist screen 401, information 510 related to an irradiation electron amount per pixel irradiated onto the sample by the
(Continued)

charged particle optical system under the observation condition.

12 Claims, 6 Drawing Sheets

(56) References Cited

U.S. PATENT DOCUMENTS

| | | | |
|---|---|---|---|
| 2006/0226362 A1 | 10/2006 | Kitsuki et al. | |
| 2011/0147587 A1* | 6/2011 | Yang | H01J 37/265 250/310 |
| 2012/0287257 A1* | 11/2012 | Chino | H01J 37/22 348/80 |
| 2013/0278745 A1* | 10/2013 | Kamio | H01J 37/244 348/80 |
| 2014/0097342 A1* | 4/2014 | Tsuno | G01B 15/04 250/307 |
| 2015/0001393 A1* | 1/2015 | Kotake | H01J 37/21 250/307 |
| 2015/0124077 A1* | 5/2015 | Fukaya | H01J 37/28 348/80 |
| 2015/0212019 A1* | 7/2015 | Shishido | G01B 15/04 250/307 |
| 2016/0203944 A1* | 7/2016 | Ominami | H01J 37/16 250/310 |
| 2016/0225583 A1* | 8/2016 | Tsuno | H01J 37/265 |
| 2016/0336145 A1* | 11/2016 | Ominami | H01J 37/222 |

OTHER PUBLICATIONS

Japanese-language Written Opinion (PCT/ISA/237) issued in PCT Application No. PCT/JP2017/015961 dated Jul. 11, 2017 (three pages).

German-language Office Action issued in German Application No. 11 2017 007 270.0 dated Apr. 27, 2022 with English translation (13 pages).

Hitachi High-Technologies Corporation, "Instruction Manual for Model S-4800 Field Emission Scanning Electron Microscope" Part No. 539-8050, 2002. Company publication (294 pages).

* cited by examiner

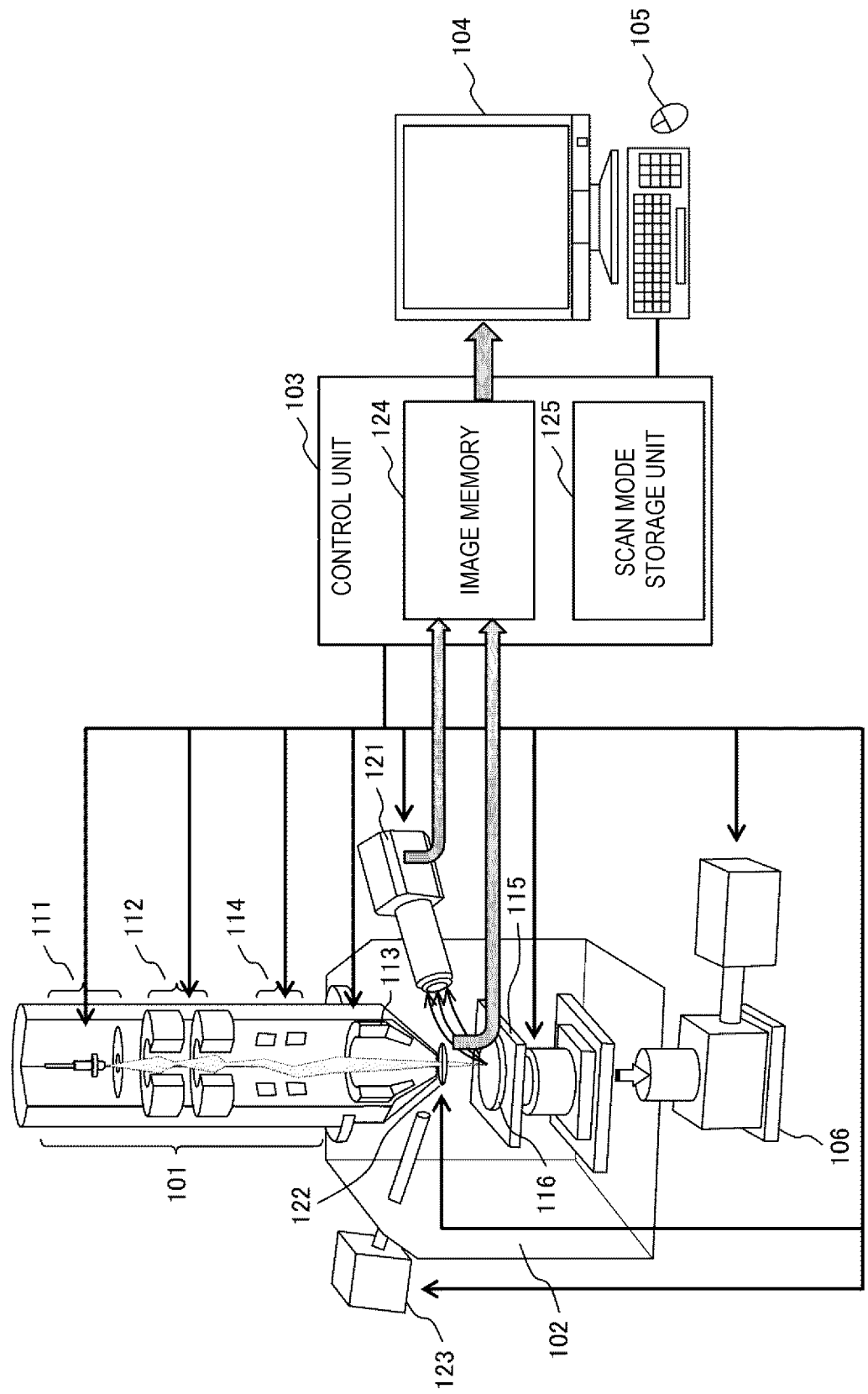
[FIG. 1]

[FIG. 2]
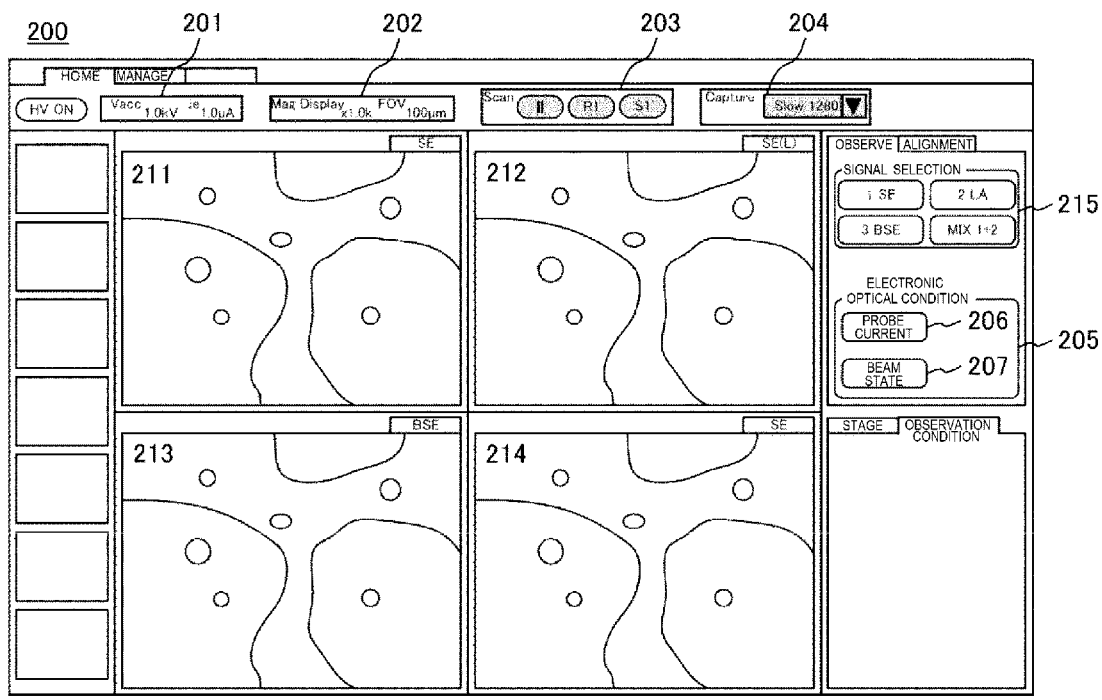
[FIG. 3]
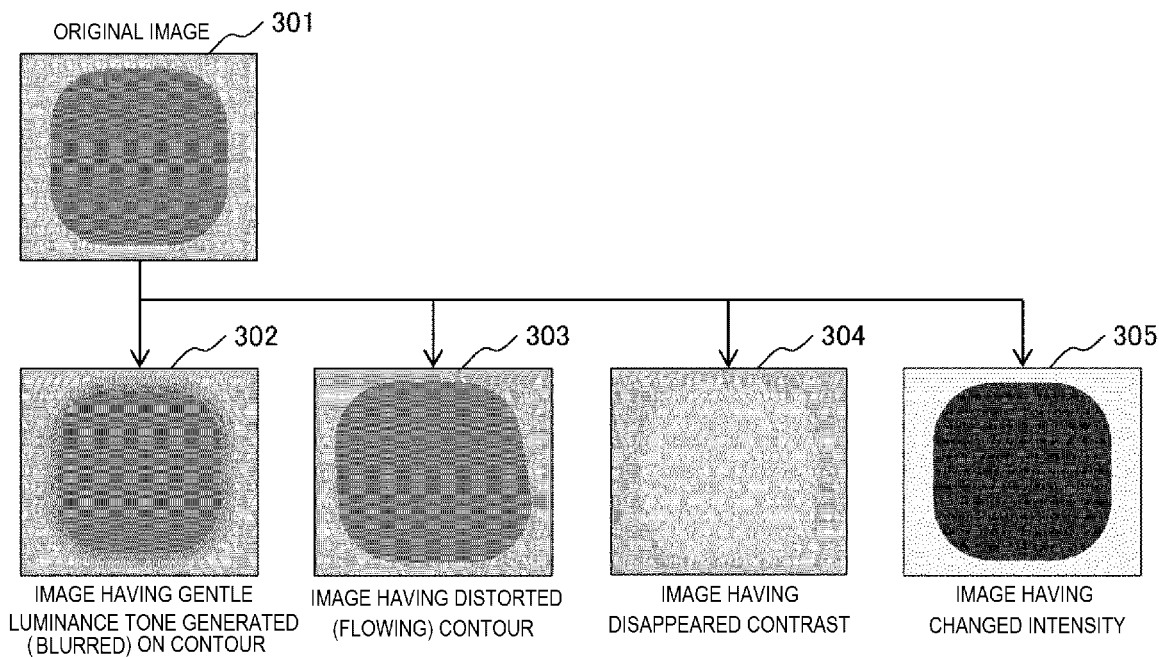

[FIG. 4]
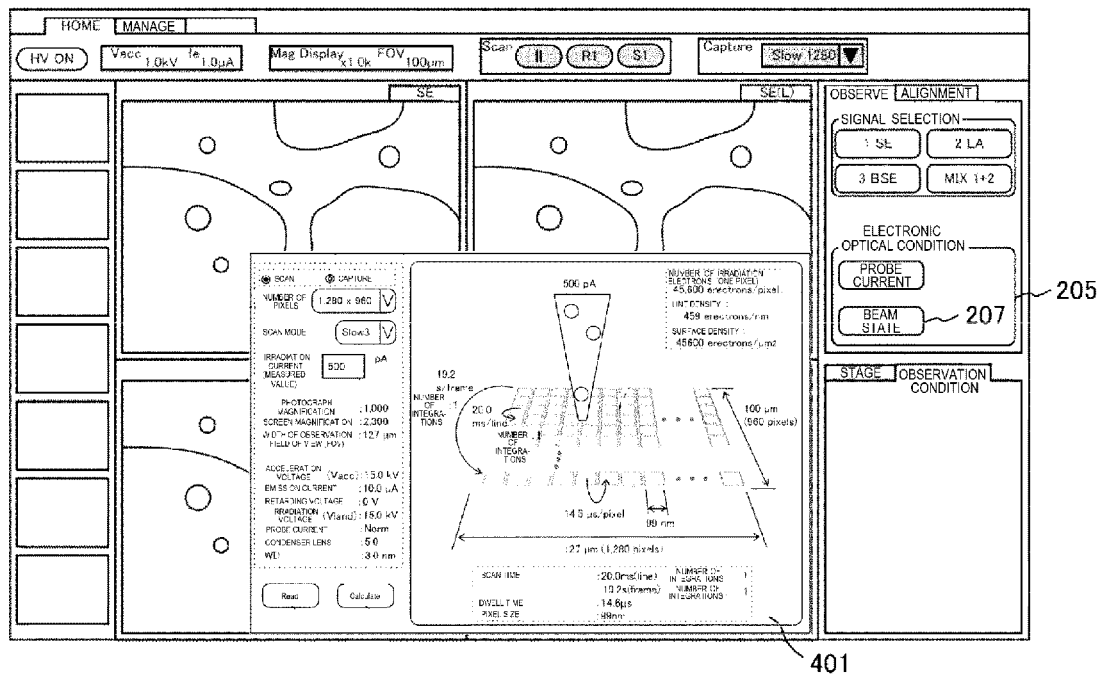
[FIG. 5]
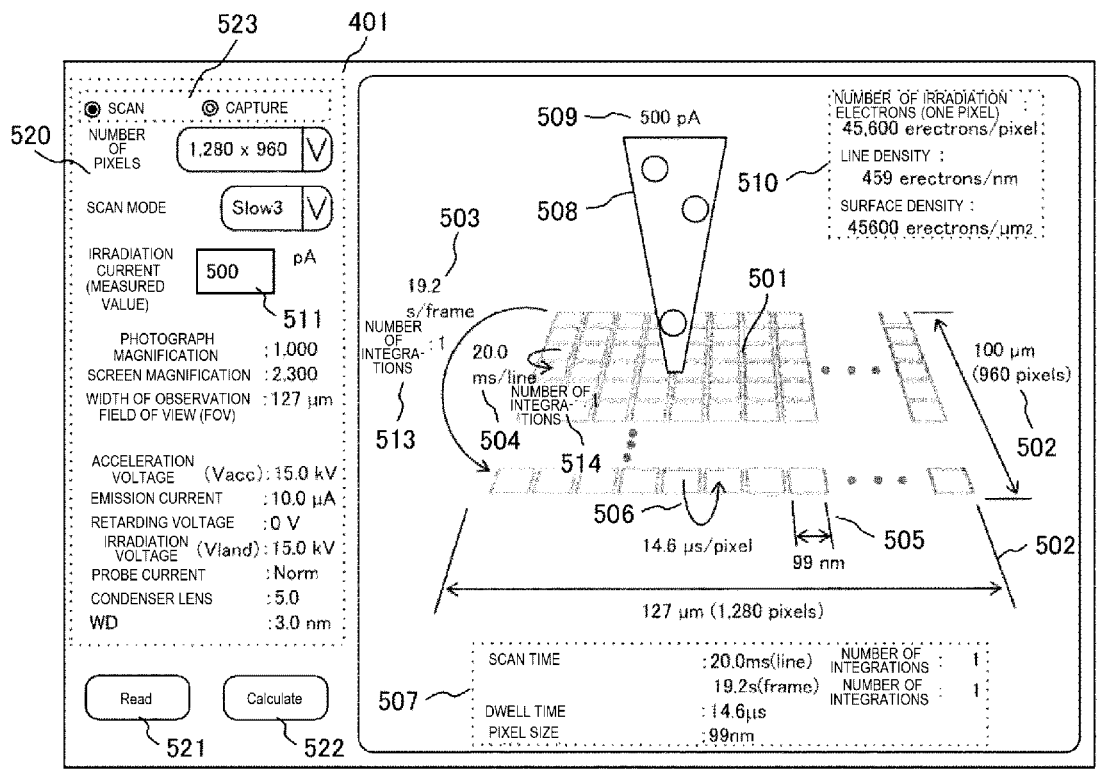

[FIG. 6]
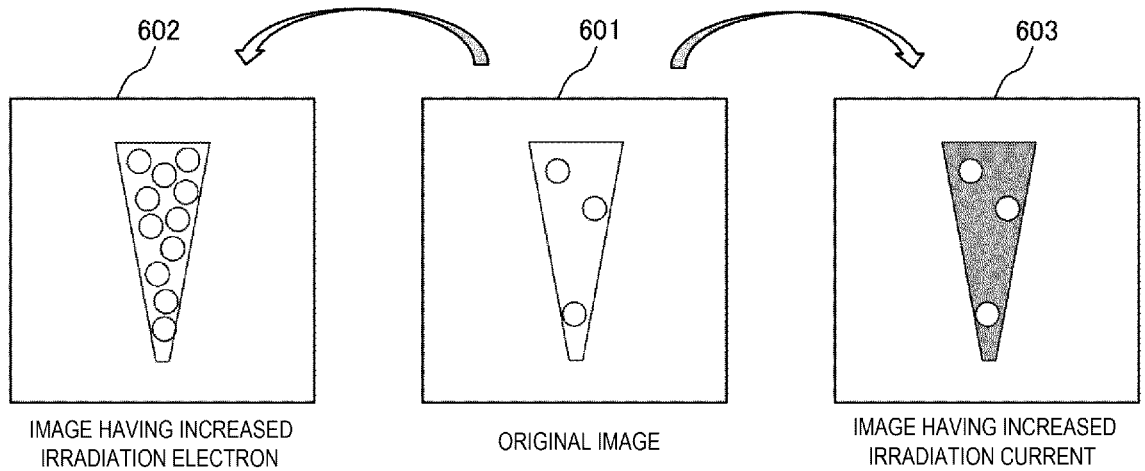
IMAGE HAVING INCREASED IRRADIATION ELECTRON
ORIGINAL IMAGE
IMAGE HAVING INCREASED IRRADIATION CURRENT
[FIG. 7]
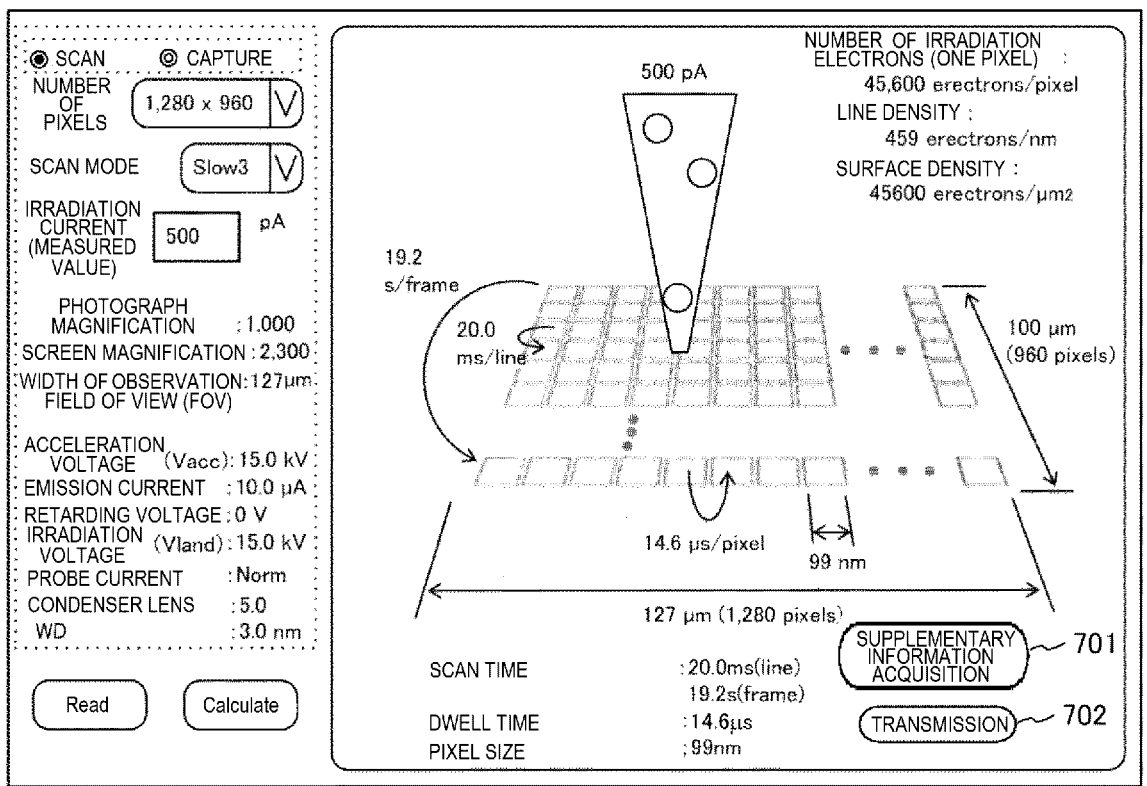

[FIG. 8]
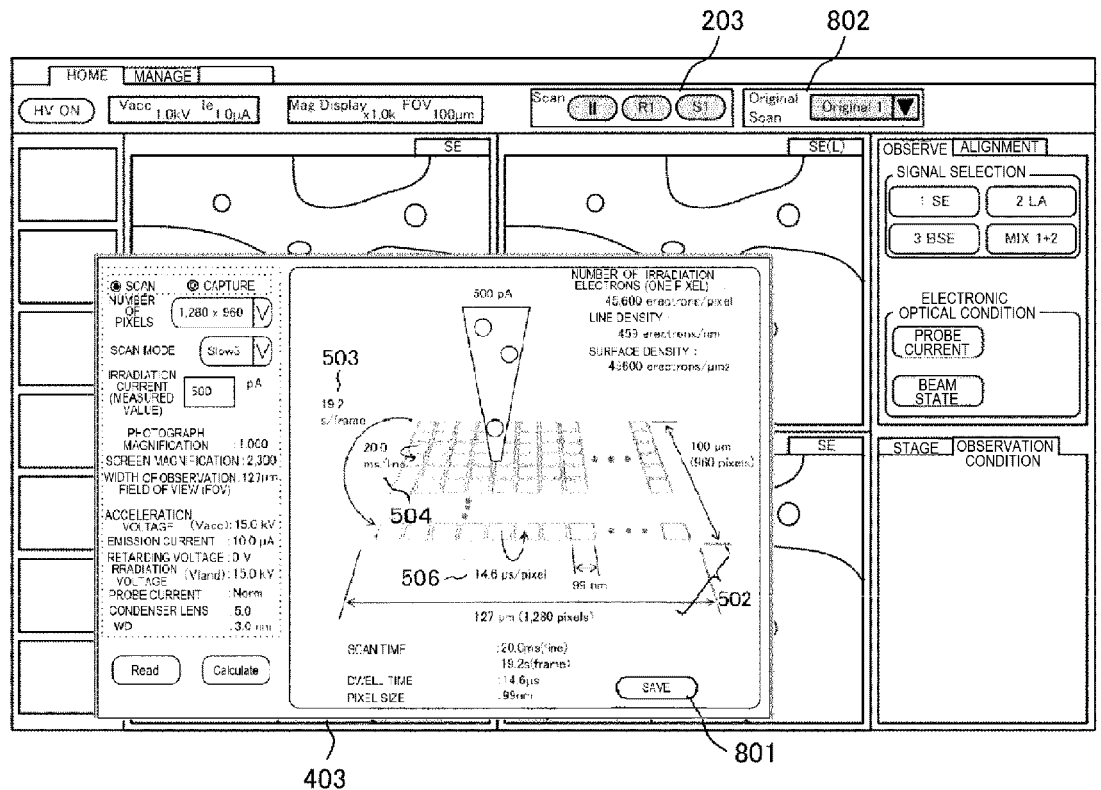
[FIG. 9]
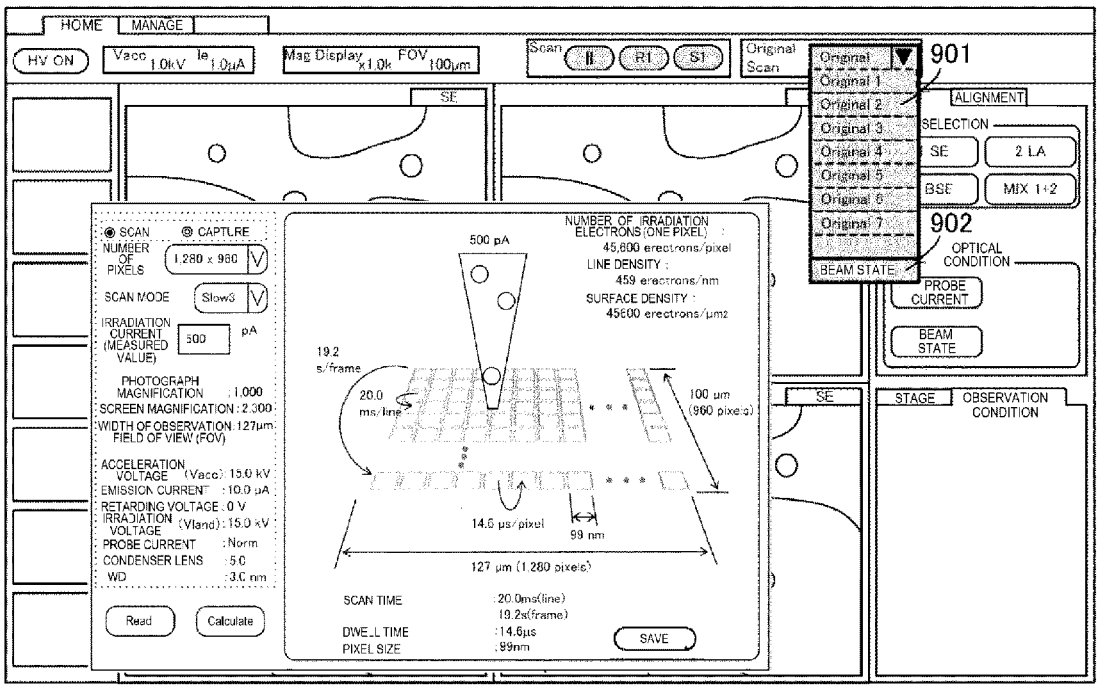

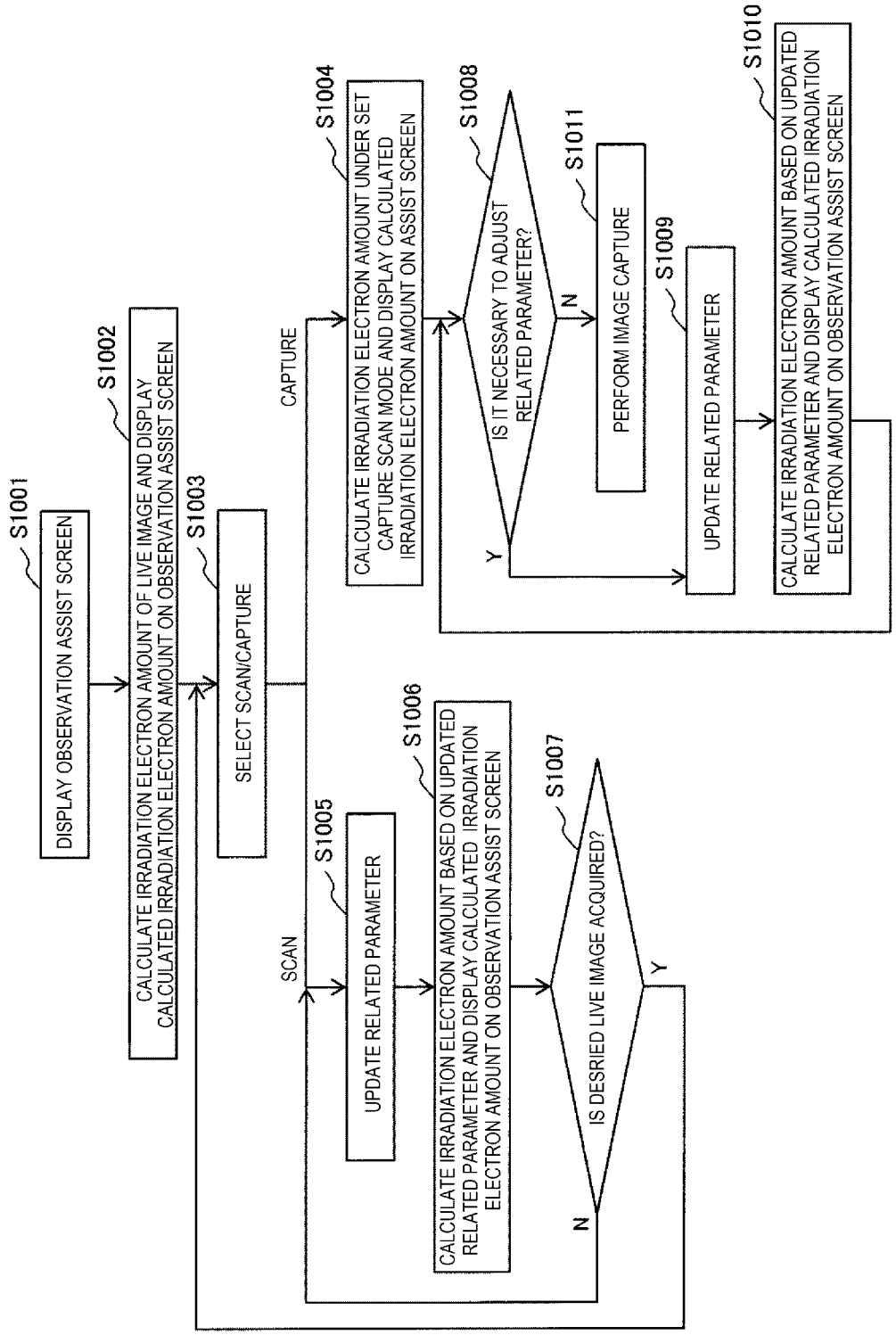
[FIG. 10]

CHARGED PARTICLE BEAM DEVICE AND METHOD FOR SETTING CONDITION IN CHARGED PARTICLE BEAM DEVICE

TECHNICAL FIELD

The present invention relates to a charged particle beam device and a method for setting a condition in the charged particle beam device.

BACKGROUND ART

A charged particle beam device performs observation, analysis, and the like on a target sample by irradiating the target sample with a charged particle beam. For example, a scanning electron microscope is a device that uses an electron beam as the charged particle beam and narrows the electron beam to irradiate and scan the sample at various speeds, so as to form an image by imaging detection signals of secondary electrons or backscattered electrons generated thereby.

The scanning electron microscope is not only used for the purpose of observing fine unevenness on the sample at high magnifications, but also is widely used in sample analysis application represented by a composition contrast image formed due to a composition difference in the sample and a voltage contrast image formed due to a minute potential difference on a surface of the sample, or in composition analysis application performed by detecting X-rays generated by electron beam irradiation. In order to obtain an image with a good S/N and clear contrast, besides irradiating the sample by narrowing the electron beam accelerated by a high voltage, it is important to appropriately set an irradiation amount and an irradiation time of the electron beam so as to scan the sample with the electron beam.

In the scanning electron microscope, since the scanning is performed with the electron beam at various speeds to form an image by imaging a detected signal of the secondary electrons or the backscattered electrons generated from the sample, an electron irradiation amount and an irradiation time per area greatly influence acquisition contrast. The operator observes the image while adjusting each of combinations and display magnifications. A dynamic range of the electron irradiation time set for forming one image is wide and is from several tens of milliseconds to several hundreds of seconds. In general, in order to acquire a high-resolution and sharp image, a scan speed of the irradiation electron is lowered to irradiate the sample for a long time, so that an image with an excellent S/N ratio is acquired. Meanwhile, when a charge or contamination problem happens due to characteristics of the sample, it is necessary to set a total irradiation time to be short, or to integrate the image acquired by shortening the irradiation time per area, so as to acquire a desired image.

In addition, since during the observation, the operator operates while changing a field of view by changing the observation magnification between several tens to several millions, an electron density per time irradiated onto per area of a sample surface is changed due to not only the electron irradiation amount and irradiation time, but also the magnification operation, and the contrast of the acquired scanning electron microscope image is also changed.

Since the image quality observed by the scanning electron microscope is changed depending on the selection on the above-described conditions, the operator is required to have knowledge of influence of the electron irradiation on the sample and the change of the contrast of the acquired image and to have proficiency level with respect to a user interface of the scanning electron microscope.

PRIOR ART LITERATURE

Patent Literature

PTL 1: JP-A-2010-16002

SUMMARY OF INVENTION

Technical Problem

In order to acquire an appropriate electron microscope image, it is important to correctly set a state of the irradiation electron with which an observation area is to be irradiated as described above. However, since the state of the irradiation electron to be considered includes the total number of the irradiation electron, a dwell time of the irradiation electron per pixel, and the like, and there are many related parameters that influence the state of the irradiation electron, including the resolution of the acquired image, a scan speed, and an irradiation current amount, the operator often finds an optimum setting according to an observation sample or a purpose by the trial and error based on experience. For example, PTL 1 discloses that the pixel number needs to be changed depending on observation applications, and that the best resolution is obtained by changing an opening angle of an electron beam according to a range of a field of view corresponding to one pixel, but does not disclose means for visually confirming the meaning of the parameters for the acquired image, so that it is difficult for the operator to set the condition by recognizing a difference in electron irradiation conditions.

Thus, in order to acquire an image with desired image contrast, the trial and error requires more operation time than expected. For an inexperienced operator, there is a problem that an image with desired high-resolution and excellent sharpness cannot be acquired due to the charge or contamination. Therefore, it is necessary to assist the operator in setting the observation conditions so as to appropriately set the electron irradiation amount, the irradiation time and a scan method.

Solution to Problem

A first invention relates to a charged particle beam device including a stage on which a sample is placed, a charged particle optical system configured to irradiate the sample with a charged particle beam, a detector configured to detect an electron generated by an interaction between the charged particle beam and the sample, a control unit configured to control the stage and the charged particle optical system according to an observation condition set by an operator and configured to form an image based on a detection signal from the detector, and a display configured to display an observation assist screen for setting the observation condition. The control unit displays, on the observation assist screen, information related to an irradiation electron amount per pixel irradiated onto the sample by the charged particle optical system under the observation condition.

In addition, a second invention relates to a method for setting a condition in a charged particle beam device, the method including: displaying, on a display, a user interface screen including a condition setting unit configured to set an observation condition for the charged particle beam device and an image display unit configured to display an observation image by the charged particle beam device; displaying, on the display, an observation assist screen including information related to an irradiation electron amount per pixel under the observation condition of the observation image; and receiving an instruction from an operation unit, and displaying, on the observation assist screen, information related to an irradiation electron amount per pixel under an image capture condition for capturing the observation image.

Advantageous Effect

By displaying the information related to the irradiation electron amount per pixel, the operator can easily set the condition for the charged particle beam device.

BRIEF DESCRIPTION OF DRAWINGS

FIG. 1 is a diagram illustrating an outline of a scanning electron microscope.

FIG. 2 is a diagram illustrating a user interface of the scanning electron microscope.

FIG. 3 is a diagram of electron micrograph images.

FIG. 4 is a diagram illustrating a display example of an observation assist screen.

FIG. 5 is a diagram illustrating details of the observation assist screen.

FIG. 6 is a diagram illustrating display examples of an electron beam image which changes.

FIG. 7 is a diagram illustrating another display example of the observation assist screen.

FIG. 8 is a diagram illustrating another display example of the observation assist screen.

FIG. 9 is a diagram illustrating another display example of the observation assist screen.

FIG. 10 is a flowchart for setting an observation condition by using the observation assist screen.

DESCRIPTION OF EMBODIMENTS

An embodiment in which the invention is applied to a scanning electron microscope will be described. The scanning electron microscope scans a sample to be observed with an irradiation electron, detects generated electrons and forms an image, and an operator observes the sample with the formed image. FIG. 1 is a diagram illustrating an outline of the scanning electron microscope. A scanning electron microscope includes a microscope body 101, a sample chamber 102, a control unit 103, a display 104, and an operation unit 105. A vacuum is maintained in the microscope body 101 and the sample chamber 102 by a vacuum pump 106. The inside of the microscope body 101 is maintained at a high vacuum, an electron beam generated by an electron gun 111 travels toward a sample 116 placed on a stage 115 of the sample chamber 102, and during this process, the electron beam is narrowed by an electromagnetic lens such as a condenser lens 112 and an objective lens 113. By applying a scanning signal to a deflection coil 114, a surface of the sample is scanned with the electron beam. Mechanisms for controlling the electron beam are collectively referred to as an electron optical system. When the surface of the sample is irradiated with the electron beam, electrons are generated by an interaction between the electron and the sample. The electrons generated from the surface of the sample include electrons having different energies due to a generation mechanism. Therefore, in order to efficiently detect each of the electrons having different energies, a plurality of detectors may be provided. In the example of FIG. 1, a secondary electron detector 121 that mainly detects secondary electrons and a backscattered electron detector 122 that mainly detects backscattered electrons having an energy higher than that of the secondary electrons are provided. Further, in order to not only form images, but also to perform elemental analysis based on characteristic X-rays generated by irradiating the sample with the electron beam, a detector such as an energy dispersive X-ray spectrometry (EDX) detector 123 may be provided. Generated electronic information detected by the secondary electron detector 121 or the backscattered electron detector 122 is stored in an image memory 124 of the control unit 103 to form into an image, and the formed image is displayed on the display 104. The control unit 103 controls each mechanism of the scanning electron microscope based on an observation condition set by the operator using the operation unit 105, and forms an image from the generated electronic information detected by the detector. Further, in order to facilitate the operator setting the observation condition, a scan mode storage unit 125 is provided in the control unit 103. A plurality of predetermined scan modes are stored in the scan mode storage unit 125, and the operator can read these modes and set the observation condition. The control unit 103 controls operations of the electron optical system of the scanning electron microscope based on the set observation condition. The control unit 103 is implemented by an information control device such as a personal computer (PC).

FIG. 2 illustrates an example of a user interface screen 200 displayed on the display 104 of the scanning electron microscope. In order to perform sample observation while adjusting the observation condition by the operator, the user interface screen 200 includes condition setting units configured to display and set the observation condition of the scanning electron microscope and an image display unit configured to display the observation image. In the example of FIG. 2, an acceleration voltage setting unit 201, a magnification setting unit 202, a scan speed setting unit 203, a capture condition setting unit 204 and an electronic optical condition setting unit 205 are provided as the condition setting units. The electron optical condition setting unit 205 includes a probe current mode setting unit 206 and a beam state setting unit 207. In addition, images (live images) 211 to 214, which are formed by the detectors provided in the scanning electron microscope and are selected by a signal selection unit 215, are displayed on the image display unit. The images can be formed based on a detection signal for each of electrons having different energies or a combination thereof, for example, the live image 211 is an image formed based on a detection signal of the secondary electron (SE), and the live image 213 is an image formed based on a detection signal of the backscattered electron (BSE). According to the purpose of the observation, the operator can select the number of the live images to be displayed or the type of the detection signal for displaying the live image using the signal selection unit 215.

The operator sets the observation condition of the scanning electron microscope based on the acceleration voltage setting unit 201, the scan speed setting unit 203, the probe current mode setting unit 206, and the like. In order to facilitate setting the observation condition of the scanning electron microscope, a plurality of modes are predetermined for the scan speed, and the operator can select one of the predetermined modes. For example, in the example of FIG. 2, buttons displayed as "R1", "S1", and the like are displayed in the scan speed setting unit 203, and each button corresponds to a mode whose scan speed, at which the electron beam scans the surface of the sample, is different. For example, the operator selects the R1 mode (TV scan mode) when searching for a desired field of view, and adjusts the live image to a desired contrast by switching to different scan speed mode or adjusting other parameters when the desired field of view is found. The magnification setting unit 202 can also adjust the magnification of the observation image. When an image to be finally acquired can be displayed on the display, the image is captured or saved to acquire a final image. An image resolution and a scan speed during the image capture are selected and set by the capture condition setting unit 204. The resolution of the final image is required to be higher than the resolution of the live image displayed on the display. Therefore, different from the observation scan mode used in searching for the field of view, the capture scan mode is predetermined according to the desired image resolution. Each of the observation scan mode and the capture scan mode which are predetermined as described above is stored in the scan mode storage unit 125 of the control unit 103 (see FIG. 1).

However, when an image with an appropriate image quality cannot be obtained by a predetermined scan mode, the operator must adjust the observation condition. In such a case, the operator tends to adjust the observation condition by trial and error based on the experience of the operator. Conditions of the irradiation electron must be set in order to adjust the contrast and the like of the image, but there are many related parameters, which causes it difficult to understand. Further, parameters necessary for adjusting the conditions of the irradiation electron may not be disclosed to the operator.

A case in which a composition contrast image of a sample containing a composition A and a composition B is acquired will be described as an example. In the composition contrast image, the contrast is formed by a difference in the number of the detected backscattered electrons generated due to the atomic number effect of the sample. In order to relatively compare composition contrast images captured at different observation conditions, for example, different magnifications, it is desirable that the contrast between an area of the composition A and an area of the composition B when performing imaging at a magnification of X is identical with the contrast between the area of the composition A and the area of the composition B when performing imaging at a magnification of Y. However, even when an approximate proportional relationship is established between the number of input electrons per pixel and the number of generated electrons, the number of parameters related to the number of the input electrons is large, and changing the magnification may change the number of the input electrons per pixel. Thus, in order to reproduce the contrast obtained by performing imaging at the magnification of X when performing imaging at the magnification of Y, it is necessary to make changes to a certain observation condition that offsets the change in the number of the input electrons accompanying the change of the magnification.

A case in which a sample having a large electrostatic capacity such as an insulating material is observed will be described as another example. It is assumed that the predetermined observation scan mode is switched to the capture scan mode, and a captured image with a high resolution is acquired under a high magnification condition. As a result, a charge-up phenomenon occurs as a result of irradiating a micro area of the sample having a large electrostatic capacity with a large number of electrons, and the contrast observed under the observation scan mode may disappear from the captured image.

FIG. 3 shows specific examples in which an appropriate observation result (captured image) cannot be obtained. An original image 301 is an image of a raw image (live image, TV image) displayed on the display, and images 302 to 305 are electron microscope images (captured images) obtained by acquiring the original image 301 under a predetermined capture scan mode. The image 302 having a gentle luminance tone generated on a contour is generated under the influence of image drift caused by the influence of the beam irradiation when a plurality of frame images are integrated to form an image. The image 303 having a distorted (flowing) contour has an image flow in the latter half of the screen for the acquired one frame image due to the influence of the charges generated by irradiating the sample with the electron beam for a relatively long time. The image 304 having a disappeared contrast is an image in which the contrast disappears due to a phenomenon such as a charge generated by the irradiation of the electron beam. The image 305 having changed intensity is an image in which the intensity of density is changed due to the changing of an S/N ratio of the detected electrons caused by changing the observation condition. These are caused by the generation of the image drift or the change-up due to a change in the number of the irradiation electron per observation area by switching the observation condition under which the original image 301 is acquired to another observation condition. Meanwhile, parameters for adjusting the optical condition include various kinds of parameters influencing the number of the irradiation electron per observation area. Therefore, in the scanning electron microscope of the present embodiment, an assist screen for adjusting the observation condition is provided by using the number of the irradiation electron per observation area as an index, so that the observation condition can be set.

A flow of setting the observation condition by using an observation assist screen is shown in FIG. 10. A flow of adjusting and setting the observation condition by the operator will be described with reference to FIG. 10 and a screen example of an operation screen displayed on the display 104. Firstly, the operator displays the observation assist screen (S1001). FIG. 4 shows an example in which the observation assist screen is displayed in the form of another window on the display 104. When the beam state button 207 of the electronic optical condition setting unit 205 is pressed on the user interface screen 200 of the scanning electron microscope, an observation assist screen 401 for displaying a SEM beam state is displayed. When the observation assist screen 401 is displayed, the user interface screen 200 may hide the electron microscope images on the image display unit. This is to avoid irradiating the sample with an unnecessary electron beam by continuing to display the live images, when it is not necessary to confirm the live images.

FIG. 5 shows details of the observation assist screen 401. In order to facilitate the operator understanding, an observation area image diagram 501 indicating an observation area for acquiring an image and an electron beam image diagram 508 indicating an electron beam to be irradiated to the observation area are displayed on the observation assist screen.

In the observation area image diagram 501, one pixel is illustrated as one square, and one frame field of view is represented as a bird's eye view. Since not all the pixels in the frame can be displayed, a part of repeated pixels is omitted, so that the sizes of one frame and one pixel can be confirmed at the same time. The observation area image display is not limited to what is shown in FIG. 5. For example, the omission of the part of pixels may be represented by a wavy line and the like instead of the dotted line as shown in the drawing, or may be separated from the frame image to represent one to a small number of pixel images by a round frame or the like. Further, a change in size may be shown by changing the color arrangement or the line type of the image diagram. In the observation area image diagram 501, a size 502 per frame, a scan time 503 per frame, a scan time 504 per line, a size 505 per pixel, a scan time (pixel time=Dwell Time) 506 per pixel are displayed together, so that the visibility of the observation area image diagram 501 is assisted. In order to easily and intuitively understand a range to be scanned, it is desirable to represent values related to the scan time not only by numerical values, but also by making effort to add an arrow mark as shown in FIG. 5. In particular, since the values of the scan time, the pixel size and the integration number are the numerical values directly influencing the number of the irradiation electron, it is desirable to collectively display the values in an area 507.

In the electron beam image diagram 508, the number of the irradiation electron and the irradiation current of the electron beam are simulated and displayed, and an irradiation current value 509 is also displayed. The irradiation current value 509 is a measured value when a measuring device such as a Faraday cup is provided on the body of the electron microscope, or an irradiation current value calculated and displayed under the observation condition based on a calibration value acquired in advance. A display example of the electron beam image diagram 508 is shown in FIG. 6. In the electron beam image diagram, the color and shape are changed according to the number of the irradiation electron and the irradiation current, so as to assist the operator in imaging a state of the electron beam. When the number of the irradiation electron increases from an original diagram 601, the number of white circles simulating the irradiation electron is increased as shown in an image diagram 602. In contrast, when the irradiation current is increased, the electron beam is changed, for example, by making a background color red as shown in an image diagram 603, such that the operator can easily and visually recognize the electron beam. When the magnification is increased, damages to the sample and contamination occurring locally which are caused by beam irradiation are generated as negative effects of increasing the density of the irradiation electron. By changing the image of the irradiation electron as shown in the image diagrams 602 and 603, it is possible to perform visually confirmation before actual image acquisition without causing damage to the sample due to the beam irradiation. It is desirable that the observation condition of the original diagram 601 as a reference can be set for each observation such that the operator can easily adjust the condition of the electron beam.

A dose amount 510 is displayed in near the image diagram. The operator can refer to this value for adjusting and setting the observation condition. As the dose amount 510, the number of the irradiation electron per pixel, the number of the irradiation electron per unit length of scanning (line density), and the number of the irradiation electron per unit area (surface density) are displayed in an example of FIG. 5. Although physical quantity corresponding to these parameters may be displayed instead, it is important that the operator can recognize that the change in the irradiation electron amount per pixel can be quantitatively compared at least when the observation condition is changed. The number of the irradiation electron per pixel is obtained by (irradiation current (pA)×pixel time (μs))/e (e: elementary charge). Further, the linear density is obtained by the number of the irradiation electron per pixel/pixel size.

In the observation assist screen 401, the related parameter set by the condition setting unit of the user interface screen 200 in the scanning electron microscope are read, and is displayed as a related parameter 520. Specifically, values set by the acceleration voltage setting unit 201, the magnification setting unit 202, the scan speed setting unit 203 and the electronic optical condition setting unit 205 are displayed as the related parameter 520.

As described above, the control unit 103 of the scanning electron microscope calculates the irradiation electron amount of the live image and displays the calculated irradiation electron amount and the parameters related to the irradiation electron amount on the observation assist screen 401 (S1002: FIG. 10). Accordingly, the operator can collectively confirm, on the observation assist screen 401, parameters for determining the beam state of the live image displayed on the image display unit and the irradiation electron amount as a result thereof.

Since scan/capture selection buttons 523 are arranged on the observation assist screen 401, the operator selects one of them (S1003). In the case of continuing the search for the observation field of view and adjusting a normal scan condition, the operator selects "scan"; in the case of determining the observation field of view and adjusting and confirming the capture scan condition, the operator selects "capture". When "capture" is selected, the related parameter of the capture scan mode set by the capture condition setting unit 204 and the irradiation electron amount calculated based on the related parameter are displayed (S1004).

After starting the observation, the operator searches for the field of view as an observation target on the sample while changing the sample position and the observation magnification under the observation scan mode. At this stage, the luminance contrast of the observation image is roughly matched, and electrons are emitted at a scan speed as fast as possible under a S/N where the search for the field of view is possible, so as to search for the field of view. In contrast, in the capture scan for acquiring the captured image, in order to acquire an image having a sufficient S/N, the operator sets the electron irradiation time per pixel to be long and integrates the image having a plurality of frames. Therefore, the capture scan setting is set separately from the setting of the previous observation scan. However, this switching may cause a difference in contrast, or cause the image drift or halation to appear due to the influence of the charge which is not observed during the searching for field of view, as described above. By selecting any one of the scan/capture selection buttons 523, it is possible to confirm the irradiation electron amount per pixel using the observation assist screen 401 under any scan mode of the normal scan and the capture scan.

A case in which the observation condition is adjusted in the observation scan will be described. When the values of the acceleration voltage setting unit 201, the magnification setting unit 202, the scan speed setting unit 203 and the probe current mode setting unit 206 are updated in a state where the observation assist screen 401 is activated (S1005), the related parameter 520 on the observation assist screen 401 is updated accordingly, and the information 501 to 514 related to the beam state is updated (S1006). In the example of FIG. 5, a read button 521 and a calculation button 522 are shown. The observation assist screen 401 may be automatically updated by changing the setting value of the condition setting unit of the user interface screen 200, or the observation assist screen 401 may be updated according to an instruction from the operator. For example, when the operator presses the read button 521, the related parameter 520 is updated; and when the operator presses the calculation button 522, the information 501 to 514 is updated by the updated related parameter 520. Since the update is performed only when the calculation button 522 is pressed, it is possible to reduce a load of the control unit that calculates the irradiation electron amount.

It is also possible to edit the related parameter on the observation assist screen 401. The related parameter 520 of the observation assist screen 401 can be edited, and when the related parameter 520 is updated and the calculation button 522 is pressed, the information 501 to 514 is updated by using the content of the edited related parameter. In the example of FIG. 5, a pixel number and a scan mode can be edited in a pull-down menu, and the irradiation current amount can be input with a numerical value to an irradiation current input box 511. By using this function, the operator can confirm the information related to the irradiation electron amount per pixel before actually changing the scan mode of the scanning electron microscope, and can set an appropriate observation condition based on the calculated irradiation electron amount per pixel. After the observation condition is determined, the operator instructs the operation unit to apply the observation condition set on the observation assist screen, thereby continuing the observation.

When a desired live image cannot be obtained, the related parameter is updated again; and when a desired live image can be obtained, the capture is selected by using the selection button 523 to set the condition of the image capture (S1007, S1003). Accordingly, the related parameter of the capture scan mode set by the capture condition setting unit 204 and the irradiation electron amount calculated based on the related parameter are displayed (S1004). The operator confirms a deviation between the irradiation electron amount per pixel under the capture scan mode and the irradiation electron amount per pixel in the observation scan displayed on the observation assist screen 401 (S1008). When the deviation is small, it is not necessary to adjust the condition, and the image capture is performed (S1011). When the deviation is large, the observation conditions related to capture scan of the capture condition setting unit 204 are adjusted (S1009), and accordingly, the related parameter 520 of the observation assist screen 401 is updated, and the information 501 to 514 related to the beam state is updated (S1010). Processes of steps S1009 and S1010 are identical with the processes of step S1005 and step S1006 respectively, and thus, a description thereof will be omitted. Accordingly, when the deviation between the irradiation electron amount in the observation scan and the irradiation electron amount in the capture scan mode is small, the image capture is executed (S1011).

In the example of FIG. 5, at least one of a photograph magnification, a screen magnification and a field of view (FOV: size of observation field of view) is displayed as the related parameter 520. As for the photograph magnification of the scanning electron microscope, a magnification is defined with a size displayed on a photograph of 127 mm×95 mm (4×5 photographic size) in the related art, but in recent years, the screen magnification is displayed in a size displayed on the display 104, or the size of the observation field of view is defined by FOV display using dimensions of the image field of view, which is complicated. As shown in FIG. 5, by displaying the size 505 per pixel and the like together on the observation assist screen 401, the operator can easily recognize the difference.

FIG. 7 illustrates a modification example of the observation assist screen. When the electron microscope image acquired by the scanning electron microscope is saved as an electronic file, the content of setting the observation condition during acquiring the electron microscope image may be saved as supplementary information, in the form of text file data, in association with the electronic file of the electron microscope image. By pressing a supplementary information acquisition button 701 provided on an observation assist screen 402, the supplementary information or the acquired electronic microscope image is selected, necessary parameters are acquired from the selected supplementary information, the acquired supplementary information is reflected in the related parameter 520 on the observation assist screen, the irradiation electron amount is calculated, and the information 501 to 514 is displayed. Accordingly, the operator can visually confirm the electron beam state or the scan condition during acquisition on the display 104 later even for the electron microscope image acquired in the past. When an identical program can be executed by an information processing device other than the control unit 103, the program can also be implemented by the information processing device other than the control unit 103.

After the supplementary information is selected and acquired from the supplementary information acquisition button 701, the observation condition can be transmitted to the condition setting unit of the user interface screen 200 by a transmission button 702. Accordingly, the observation condition identical with the condition during acquiring the electron microscope image in the past can be reproduced.

FIG. 8 and FIG. 9 show other modification examples of the observation assist screen. In an observation assist screen 403 shown in FIG. 8, the parameter 504 related to displayed line scanning, the parameter 503 related to frame scanning, the parameter 506 related to the pixel time, and the pixel number 502 can be edited from the observation assist screen 403, and the setting of the scanning electron microscope can be directly changed. The operator can name and save the scan mode having the edited parameter by a save button 801 on the observation assist screen 403. Information of the saved scan mode is stored in the scan mode storage unit 125 of the control unit 103 as an original scan mode. An original scan mode setting unit 802 is provided on the user interface screen 200 in the identical manner as the standard scan speed setting unit 203, such that the saved scan mode can be called as an operator original scan mode. An example of the user interface in which the original scan mode setting unit 802 is arranged is shown in FIG. 9.

In FIG. 9, it is a feature that a standard scan mode that is used frequently as the scan mode that is edited and generated by the operator can be displayed as a scan mode list 901. Accordingly, once the scan mode list is determined, it is possible to easily set the scan mode saved in advance according to the observation target or the purpose. Further, even during routine observation, the operator does not need to repeatedly edit the scan setting, and can perform observation with a high throughput. An observation assist button 902 (for example, a beam state button) for transiting to the observation assist screen 403 may be provided in the scan mode list.

An example in which the invention is applied to the scanning electron microscope has been described above. The applicable object is not limited to this, and the invention can also be applicable to a microscope for observing a sample with electron beam irradiation, for example, a transmission electron microscope or a scanning transmission electron microscope; and the invention is also applicable to a Focused Ion Beam (FIB) for irradiating a sample with an ion beam.

In addition, a method for displaying the operation screen on the display is not limited to those described in the embodiment, and various modifications can be made. For example, although the observation assist screen is displayed in the form of another window separated from the user interface screen 200, the observation assist screen may be displayed in the same window as a part of the user interface screen. Further, for example, when the related parameter is updated on the observation assist screen, or when the scan and the capture are switched, a plurality of the observation assist screens may be displayed, or information before update may be left on the observation assist screen for displaying, such that information of the new and old observation assist screens can be easily compared.

REFERENCE SIGN LIST

101: Microscope body
102: Sample chamber
103: Control unit
104: Display
105: Operation unit
106: Vacuum pump
111: Electron gun
112: Condenser lens
113: Objective lens
114: Deflection coil
115: Stage
116: Sample
121: Secondary electron detector
122: Backscattered electron detector
123: EDX detector
124: Image memory
125: Scan mode storage unit

The invention claimed is:

1. A charged particle beam device, comprising:
a stage on which a sample is placed;
a charged particle optical system configured to irradiate the sample with a charged particle beam;
a detector configured to detect an electron generated by an interaction between the charged particle beam and the sample;
a control unit configured to control the stage and the charged particle optical system according to an observation condition set by an operator, and configured to form an image based on a detection signal from the detector; and
a display configured to display an observation assist screen for setting the observation condition, wherein
the control unit displays, on the observation assist screen, information related to an irradiation electron amount per pixel irradiated onto the sample by the charged particle optical system under the observation condition,
the control unit displays, on the observation assist screen, at least one of a number of irradiation electrons per pixel, a number of irradiation electrons per unit length of scanning and a number of irradiation electrons per unit area as the information related to the irradiation electron amount per pixel, and
information related to an irradiation electron amount per pixel under a search condition for searching a field of view according to the observation image is displayed on the observation assist screen.

2. The charged particle beam device according to claim 1, wherein
the control unit also displays, on the observation assist screen, a related parameter that influences an image quality of the image.

3. The charged particle beam device according to claim 2, further comprising:
an operation unit configured to receive input from the operator, wherein
the control unit displays, on the observation assist screen, information related to the irradiation electron amount per pixel irradiated onto the sample by the charged particle optical system under an observation condition to which the related parameter that is edited by the operation unit on the observation assist screen is applied.

4. The charged particle beam device according to claim 3, wherein
the control unit receives an instruction from the operation unit and controls the stage and the charged particle optical system according to the observation condition to which the related parameter edited by the operation unit is applied.

5. The charged particle beam device according to claim 3, wherein
the control unit includes a scan mode storage unit configured to store a predetermined scan mode, and
the control unit stores a scan mode to which the related parameter edited by the operation unit is applied as an original scan mode in the scan mode storage unit, and is capable of reading the predetermined scan mode or the original scan mode when setting the observation condition.

6. The charged particle beam device according to claim 1, wherein
the control unit reads an observation condition included in supplementary information in association with an image stored as an electronic file, and displays, on the observation assist screen, the information related to the irradiation electron amount per pixel irradiated onto the sample by the charged particle optical system under the observation condition included in the supplementary information.

7. A method for setting a condition in a charged particle beam device, the method comprising:
displaying, on a display, a user interface screen including a condition setting unit configured to set an observation condition for the charged particle beam device and an image display unit configured to display an observation image by the charged particle beam device;
displaying, on the display, an observation assist screen including information related to an irradiation electron amount per pixel under an observation condition of the observation image; and
receiving an instruction from an operation unit, and displaying, on the observation assist screen, information related to an irradiation electron amount per pixel under an image capture condition for capturing the observation image;
wherein at least one of a number of irradiation electrons per pixel, a number of irradiation electrons per unit length of scanning and a number of irradiation electrons per unit area is displayed on the observation assist screen as the information related to the irradiation electron amount per pixel; and
wherein information related to an irradiation electron amount per pixel under a search condition for searching a field of view according to the observation image is displayed on the observation assist screen.

8. The method for setting a condition in a charged particle beam device according to claim 7, further comprising:

displaying, on the observation assist screen, a related parameter that influences an image quality of the observation image or a captured image acquired by capturing the observation image;

editing, by the control unit, the related parameter displayed on the observation assist screen; and displaying, on the observation assist screen, information related to the irradiation electron amount per pixel under an observation condition to which the related parameter edited by the operation unit is applied.

9. The method for setting a condition in a charged particle beam device according to claim 8, further comprising:

receiving an instruction from the operation unit, and displaying the observation image or acquiring the captured image under an observation condition to which the related parameter edited by the operation unit is applied.

10. The method for setting a condition in a charged particle beam device according to claim 8, further comprising:

storing a scan mode to which the related parameter edited by the operation unit is applied as an original scan mode.

11. The charged particle beam device according to claim 1, wherein an observation image of a field of view on the sample searched under an observation scan mode is captured under a capture scan mode; and the control unit displays, on the observation assist screen, information related to the irradiation electron amount per pixel under the observation condition according to the observation scan mode and information related to the irradiation electron amount per pixel under the observation condition according to the capture scan mode.

12. A charged particle beam device, comprising:

a stage on which a sample is placed;

a charged particle optical system configured to irradiate the sample with a charged particle beam;

a detector configured to detect an electron generated by an interaction between the charged particle beam and the sample;

a control unit configured to control the stage and the charged particle optical system according to an observation condition set by an operator, and configured to form an image based on a detection signal from the detector; and a display configured to display an observation assist screen for setting the observation condition; wherein an observation image of a field of view on the sample searched under an observation scan mode is captured under a capture scan mode;

the control unit displays, on the observation assist screen, information related to an irradiation electron amount per pixel irradiated onto the sample by the charged particle optical system under the observation condition according to the observation scan mode and information related to the irradiation electron amount per pixel under the observation condition according to the capture scan mode; and information related to an irradiation electron amount per pixel under a search condition for searching a field of view according to the observation image is displayed on the observation assist screen.

* * * * *